United States Patent [19]
Kitamura et al.

[11] Patent Number: 5,933,942
[45] Date of Patent: Aug. 10, 1999

[54] COMPONENT MOUNTING APPARATUS

[75] Inventors: Naoyuki Kitamura, Hirakata; Wataru Hirai, Osaka; Noriaki Yoshida, Ikeda, all of Japan

[73] Assignee: Matsushita Electric Industrial Co.,Ltd., Osaka, Japan

[21] Appl. No.: 08/912,093

[22] Filed: Aug. 15, 1997

[30] Foreign Application Priority Data

Aug. 19, 1996 [JP] Japan .................................. 8-217178

[51] Int. Cl.⁶ .................................................. B23P 19/00
[52] U.S. Cl. .............................. 29/740; 29/743; 29/759; 29/760; 269/231; 269/235
[58] Field of Search ............................. 29/739, 740, 743, 29/759, 760; 269/231, 233, 235, 309

[56] References Cited

U.S. PATENT DOCUMENTS

| | | | |
|---|---|---|---|
| 2,430,613 | 11/1947 | Hodge . | |
| 5,129,637 | 7/1992 | Ito et al. ................................... | 269/231 |
| 5,193,268 | 3/1993 | Ono et al. ................................. | 29/739 |
| 5,319,846 | 6/1994 | Takahashi et al. ........................ | 29/740 |
| 5,323,528 | 6/1994 | Baker ........................................ | 29/721 |
| 5,456,001 | 10/1995 | Mori et al. ................................ | 29/739 |
| 5,740,604 | 4/1998 | Kitamura et al. ......................... | 29/832 |

*Primary Examiner*—Lee W. Young
*Assistant Examiner*—Kevin G. Vereene
*Attorney, Agent, or Firm*—Price, Gess & Ubell

[57] ABSTRACT

A component mounting apparatus for automatically mounting components on a circuit board includes a mounting unit for picking up a component from a component pickup location and mounting it at a mounting location. The mounting table can be driven to the pickup location and can removably secure a cassette table that can support a plurality of components that are to be mounted on the circuit board. A cassette table can be removable clamped to the mounting table. A carrier cart can transport the cassette table to a position for attachment to the mounting table. The carrier cart can be appropriately aligned and secured relative to the mounting table to enable the cassette table to be removably attached to the mounting table.

12 Claims, 5 Drawing Sheets ically to a component mounting apparatus equipped with a plurality of component feeder tables, each component table loaded with rows of parts cassettes and having a cassette carrying section arranged detachable by means of a carrier cart.

COMPONENT MOUNTING APPARATUS

BACKGROUND OF THE INVENTION

1. Field of the Invention

The present invention relates to a component mounting apparatus for mounting a variety of components such as electronic components onto a circuit board, and particularly to a component mounting apparatus equipped with a plurality of component feeder tables, each component table loaded with rows of parts cassettes and having a cassette carrying section arranged detachable by means of a carrier cart.

2. Description of Related Art

In such an electronic component mounting apparatus, the parts cassettes filled with a multiplicity of electronic components and carried in rows on the component feeder table are directed to and positioned at a component pickup location in sequence where desired components are picked up from the corresponding parts cassettes and mounted onto a circuit board by a mounting head.

One of such conventional component mounting apparatuses will now be explained referring to FIG. 5.

As shown in FIG. 5, at a front side of a main body 41 of the component mounting apparatus, a board positioning unit 42 for positioning a circuit board 2 on which components are mounted, a board discharging means 43 for supplying the circuit board 2, and a board removing means 44 for removing the circuit board 2 are disposed. A component feeder unit 45 is disposed behind the main body 41. Between the board positioning unit 42 and the component feeder unit 45 is a rotary mounting head 46 for picking up the components at a component pickup location on the component feeder unit 45 and mounting them onto the circuit board 2 on the board positioning unit 42.

The component feeder unit 45 includes a couple of component feeder tables 47 and 48, each having rows of parts cassettes 49 carried in parallel with each other thereon and arranged to be separately movable along guide rails 50 in lateral directions, i.e. along the direction of the rows of the parts cassettes 49. While the component feeder table 47 feeds the components, the component feeder table 48 is at its retracted position where exhausted parts cassettes 49 are replaced with new ones or new components are replenished, hence allowing the component mounting apparatus to be operated without having a downtime.

However, in such a prior arrangement described above, the component feeder table 47 often exhausts all components before the other component feeder table 48 is made ready to replace the component feeder table 47, especially in a production of different models of circuit board 2 in small quantity, causing a downtime and declining the efficiency of production.

Similarly, when the circuit board 2 requires so many kinds of components that both tables 47 and 48 need to carry different types of components to be mounted, one table cannot be replenished while the other is in operation, causing reduction in productivity.

To solve these problems, the number of parts cassettes carried on the component feeder tables 47 and 48 may be increased. This, however, increases the total weight of the component feeder tables 47 and 48 and will prevent high-speed movements thereof. Also, it will take more time for filling the tables 47 and 48 with the parts cassettes 49 hence decreasing the efficiency of production.

BRIEF SUMMARY OF THE INVENTION

It is thus an object of the present invention to provide a component mounting apparatus which is capable of yielding different models of circuit board in small quantity and mounting a great number of components of different types onto a single circuit board without impairing its production efficiency.

Other and further objects, features and advantages of the invention will appear more fully from the following description.

DETAILED DESCRIPTION OF THE PREFERRED EMBODIMENTS

One embodiment of a component mounting apparatus according to the present invention will be hereinafter described in conjunction with the accompanying drawings.

Figure 1:
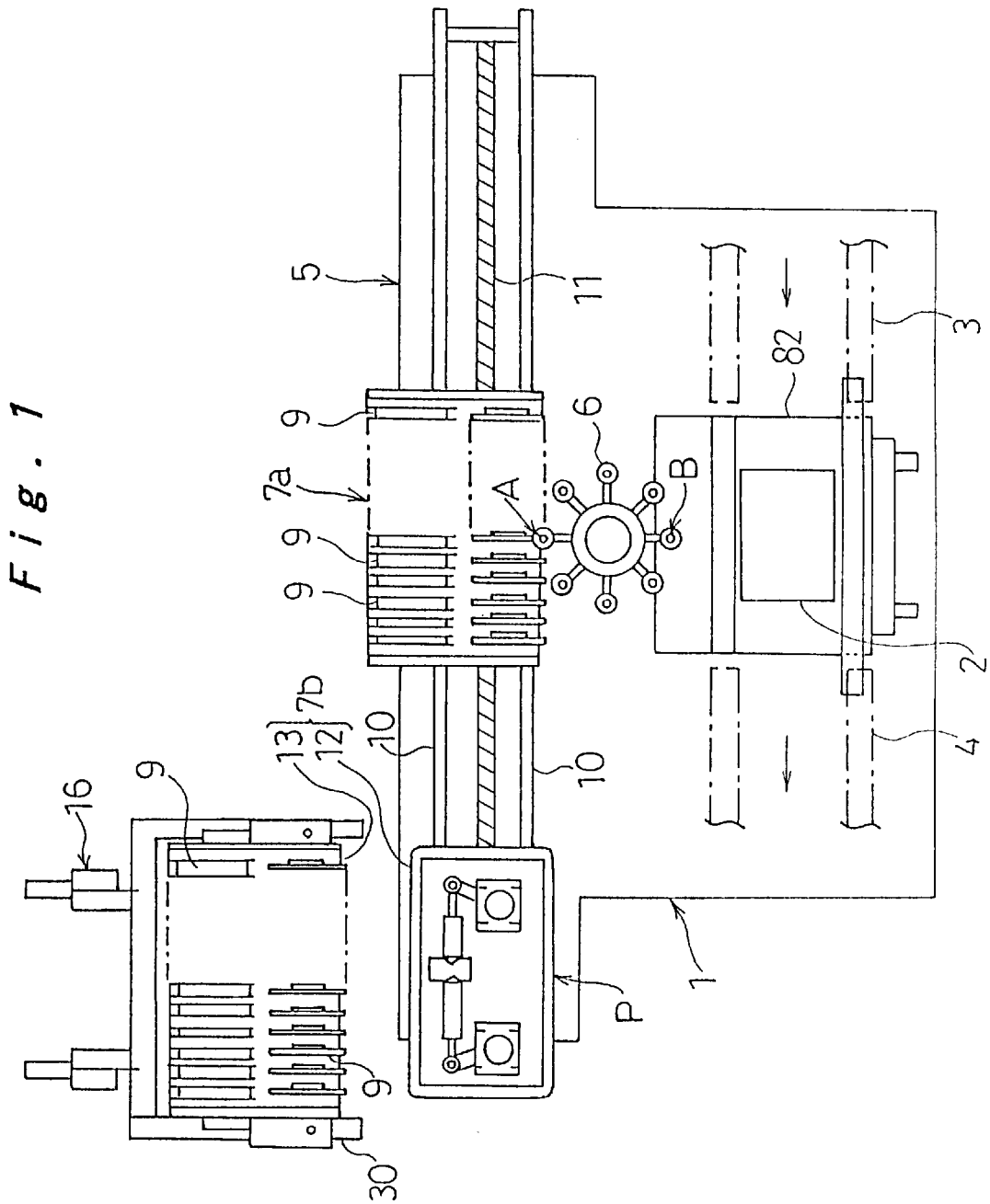
FIG. 1 is a plan view showing one embodiment of the present invention.

As shown in FIG. 1, a main body 1 of the component mounting apparatus comprises a board positioning unit 82 comprising X and Y tables disposed on a front side thereof for positioning a circuit board 2 to a predetermined location B, a board loading means 3 for supplying the board 2, and a board unloading means 4 for unloading the board 2 on which components have been mounted. A component feeder unit 5 is provided on a rear side of the main body 1. A rotary mounting head 6 is disposed between the board positioning unit 82 and the component feeder unit 5 for picking up a component from the component feeder unit 5 at a component pickup location A and mounting it onto the board 2 at a mounting location B.

The component feeder unit 5 has a couple of component feeder tables 7a and 7b, each carrying a plurality of parts cassettes 9 aligned in a row, arranged for movements in both directions along and on a pair of guide rails 10, 10. For that purpose, a ball lead screw 11 is provided to extend along the guide rails 10, 10, and each of the two component feeder tables 7a and 7b is equipped with a driving means (not shown) which mates with and runs on the ball lead screw 11.

Each component feeder table 7a and 7b comprises a cassette table 13 and a movable table 12 which are detachably coupled to each other. The parts cassettes 9 are placed on the cassette table 13 in multiplicity. The movable table 12 is joined to the above-mentioned driving means for movements in both directions along the ball lead screw 11 and the guide rails 10, 10, and is arranged to be positioned at the component pickup location A as well as at a table switch location P described later.

In particular, the movable table 12 has two support bars 314, 314 mounted on the top surface at both lengthwise ends. Each support bar 314 has a V-shaped notch 319 formed at the distal end thereof and a front positioning roller 312 mounted on the proximal end thereof. On the outer side of each support bar 314 is a plate 313 for controlling positions in lateral directions. On the inner side of each support bar 314 is a pair of air ejecting outlets 317, 317.

Figure 3:
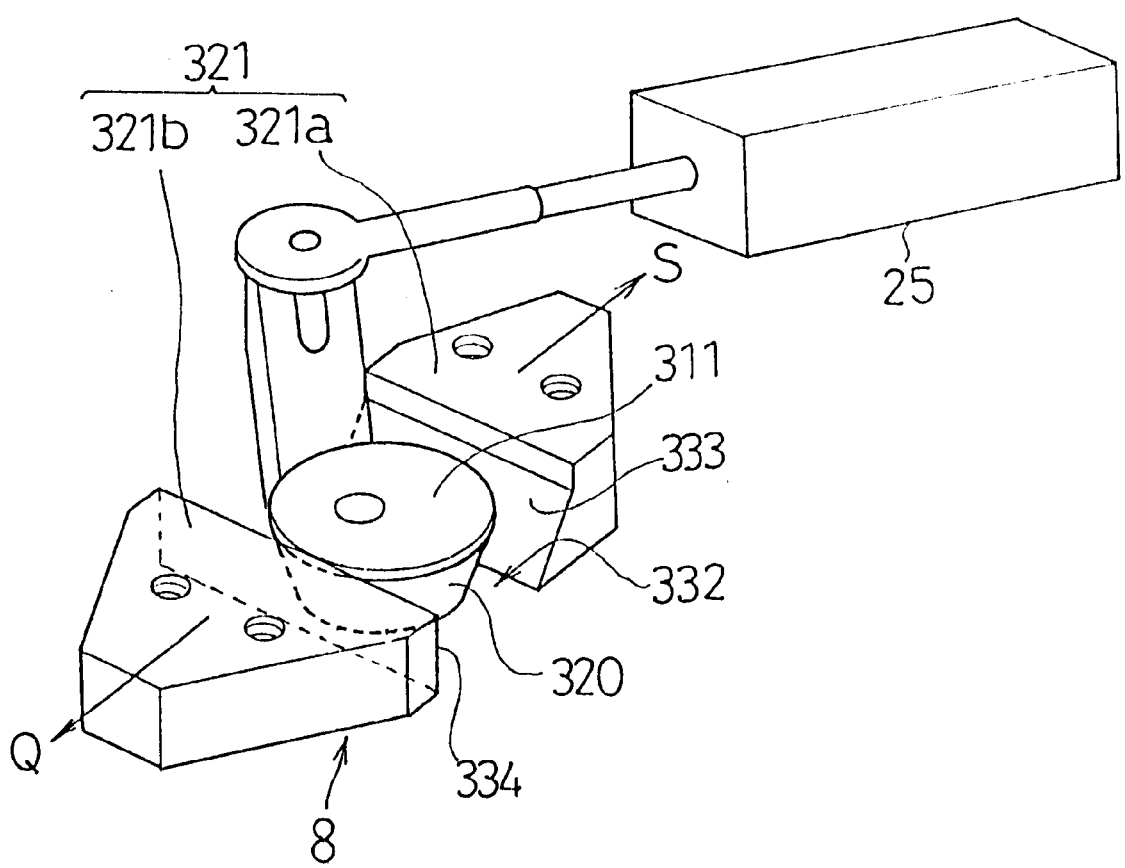
FIG. 3 is a perspective view of a primary part of the component feeder table.

A clamp mechanism (a clamping means) 8 is provided between the two support bars 314, 314 on the top surface of the movable table 12 for clamping the cassette table 13. The clamp mechanism 8 includes a pair of right and left eccentric cams (rotary clamps) 311, 311, and a pair of air cylinders 25, 25 for rotating their respective eccentric cams 311, 311 by a predetermined angle. Each eccentric cam 311 has a circumferential side 320 thereof tapered downwardly with its diameter being reduced as shown in FIG. 3.

Figure 2:
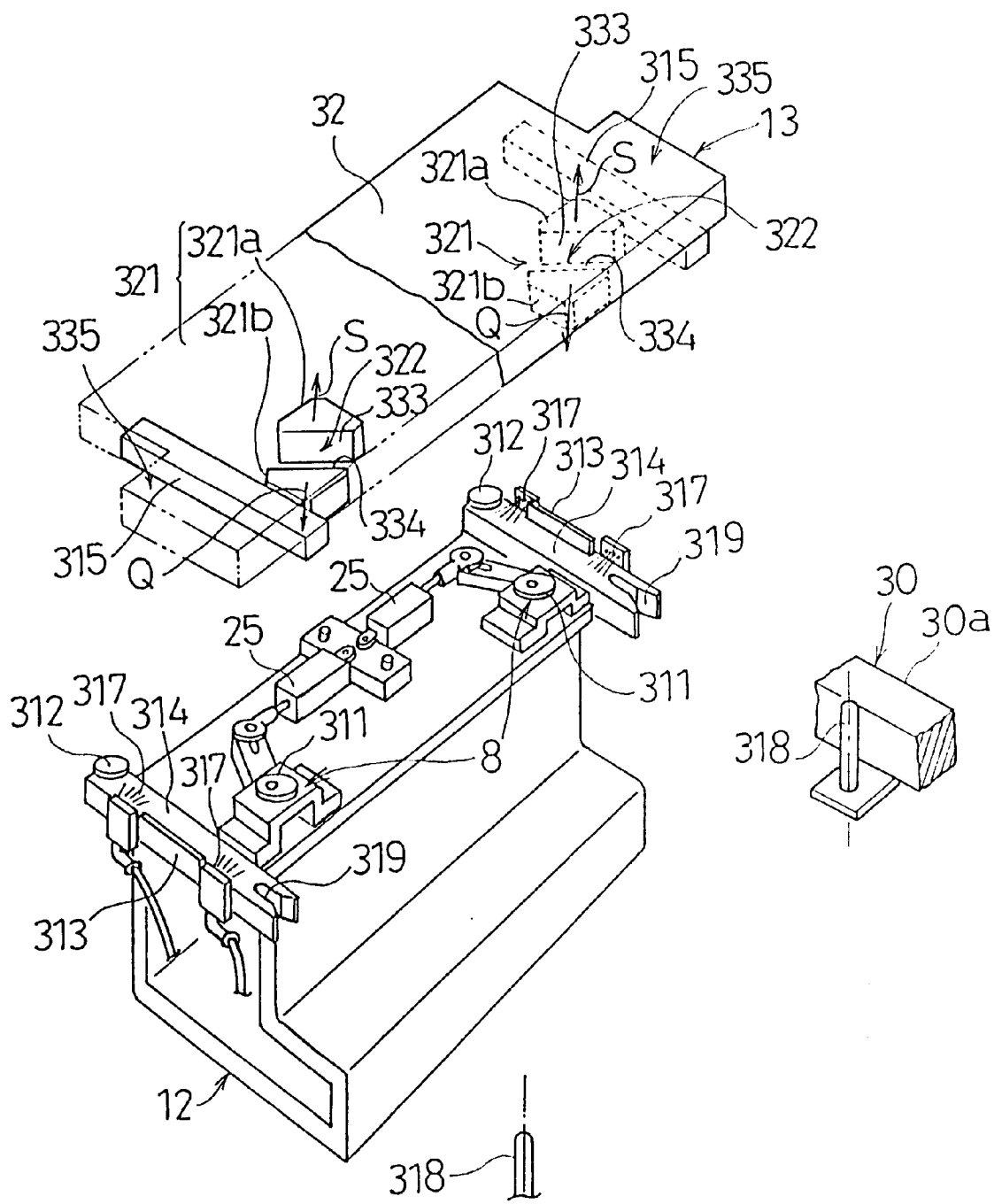
FIG. 2 is a perspective view of a component feeder table of the embodiment in its separated state.

The cassette table 13 comprises a table plate 32 on which the parts cassettes 9 are carried. Mounted to the bottom side of the table plate 32 are a pair of right and left position controlling bars 315, 315 which are seated on the support bars 314, 314 respectively, and a pair of right and left engaging blocks 321, 321 for engaging with the two eccentric cams 311, 311 respectively. Each engaging block 321 is mainly comprised of a clamp side block 321a and a release side block 321b, between which a space 322 is made for receiving the eccentric cam 311 therein. The spaces 322, 322 are arranged in parallel with each other and at an angle of 45 degrees with respect to the moving direction of the table 12, as shown in FIGS. 2 and 3. Similarly, the engaging surfaces 333, 333 of the two clamp side blocks 321a, 321a as well as the contacting surfaces 334, 334 of the two release side blocks 321b, 321b are oriented in the same direction. The engaging surface 333 is sloped toward the bottom while the contracting surface 334 is vertically configured as shown in FIG. 3. The table plate 32 of the cassette table 13 has a right and a left ends 335, 335 thereof extending outwardly from the position controlling bars 315, 315 so that both ends 335, 335 are supported from below by a fork 30 of a carrier cart 16 which will be explained later.

The component feeder tables 7a and 7b of the component feeder unit 5 travel within the range which can be divided into three areas; central component feeding area and two retraction areas on either side. When one of the component feeder tables 7a and 7b is retreated in either side of the retraction areas, the consumed set of parts cassettes 9 is exchanged in whole by separating the cassette table 13 from the movable table 12 and it is replaced with a new cassette table 13 which is loaded with a new set of parts cassettes 9 by means of the carrier cart 16.

Figure 4B:
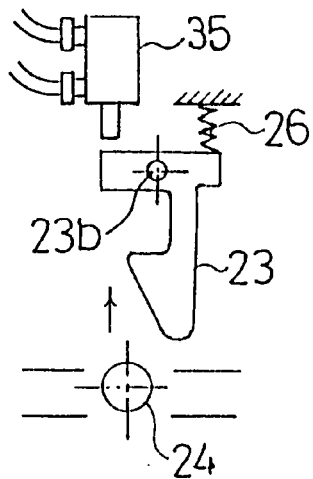
FIG. 4B is a plan view of a forward and backward positioning means of the carrier cart.
Figure 4A:
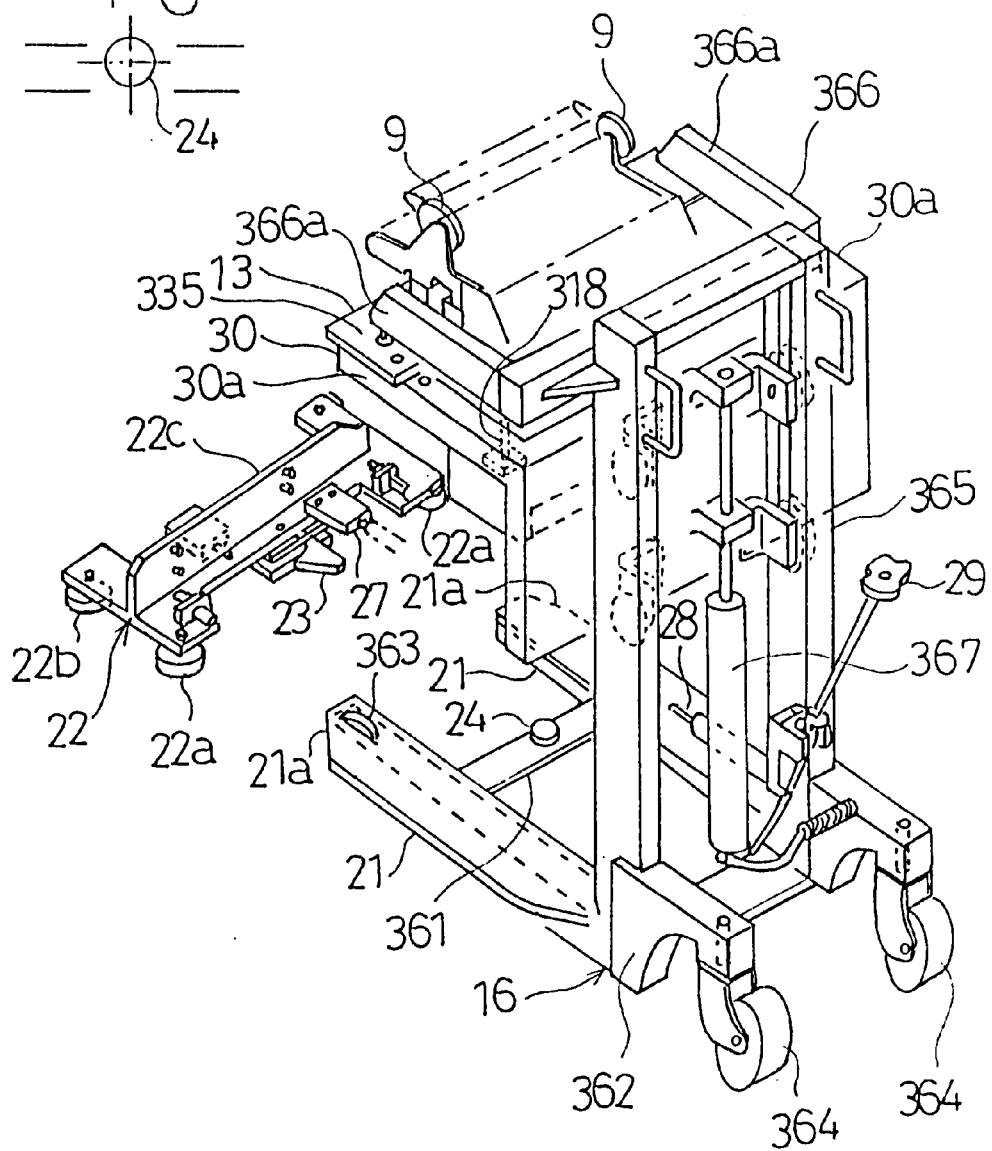
FIG. 4A is a perspective view illustrating the positioning of a carrier cart in the embodiment.
Figure 5:
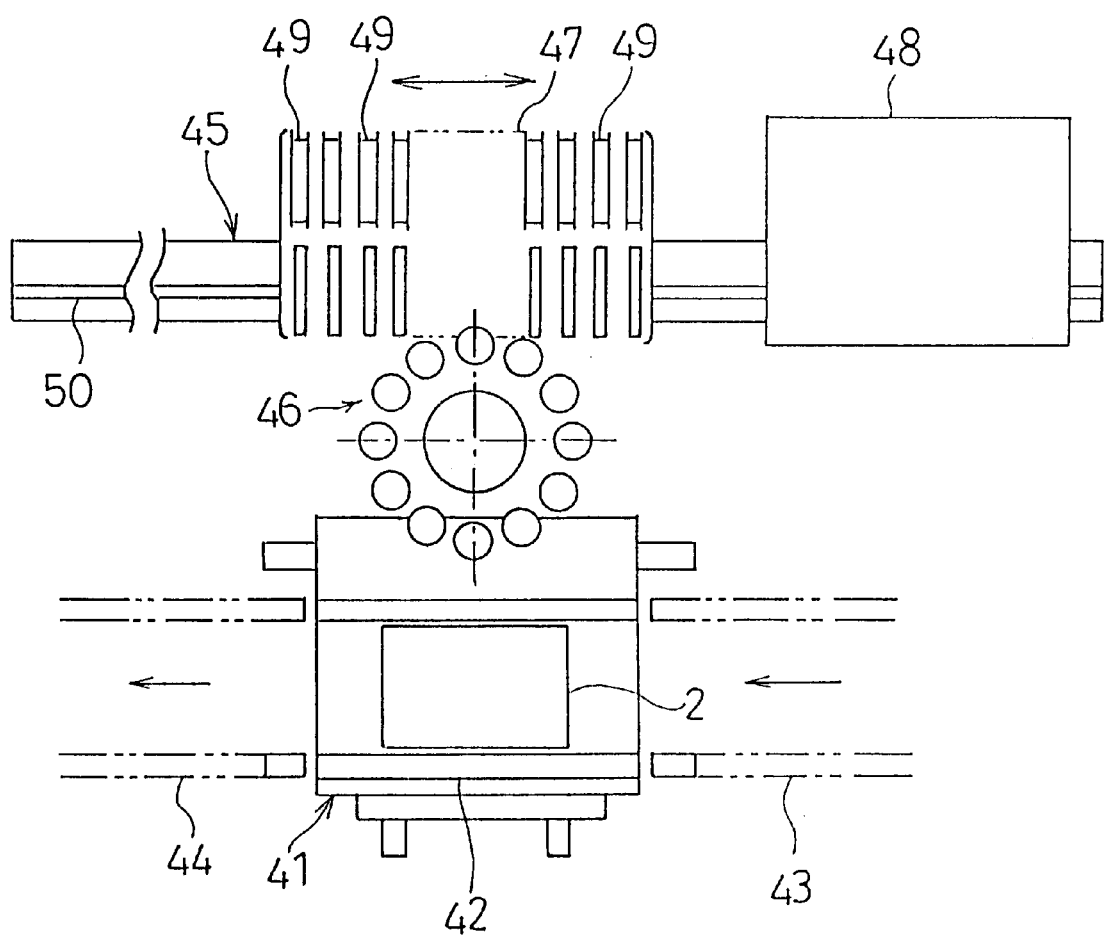
FIG. 5 is a schematic plan view showing a conventional component mounting apparatus.

Referring now to FIG. 4A, the carrier cart 16 is comprised of a base frame 362 having a pair of legs 21, 21 projecting forwardly which are connected by a bracing strut 361 and a pair of supporting posts 365, 365 disposed upright on the back side thereof. A pair of fixed wheels 363, 363 and a pair of free wheels 364, 364 are mounted to the front and rear ends of the base frame 362 respectively. A fixing frame 366 having two forwardly projected extensions 366a mounted to the upper end of the supporting posts 365, below which the fork 30 is disposed in such a way that it is vertically movable guided by the supporting posts 365. The fork 30 has right and left forwardly extending arms 30a, 30a and is vertically driven by a hydraulic cylinder 367 activated by an operation handle 29. Each leg 21 has its guide face 21a outwardly extended, one side of which is diagonally trimmed at a distal end thereof. The bracing strut 361 has a matching roller 24 mounted in the center and on the top thereof for controlling positions in forward movement. At the proximal end on an inner side of the arms 30a, 30a of the fork 30 are locator pins 318, 318 on both sides respectively (See FIG. 2). Also shown in FIG. 4A is a lock release switch 28.

A position controller 22 shown in FIG. 4A is provided beneath each of the two retraction areas of the component feeder unit 5 for defining both longitudinal and transverse position of the carrier cart 16. A pair of position controlling rollers 22a, 22a is respectively provided at both fore and rear ends on either side of a support member 22c of the position controller 22. A hook 23 is disposed substantially at the center of the support member 22c for detachably coupling with the matching roller 24 on the carrier cart 16. As best shown in FIG. 4B, the hook 23 is rotated around a pivotal axis 23b thereof and is usually retained in its reference position by a spring 26. When the matching roller 24 comes in, the hook 23 is first turned in a counterclockwise direction and then returned to engage with the matching roller 24. The engagement between the hook 23 and the matching roller 24 is released by a release cylinder 35. A block 27 is provided which comes in contact with the lock release switch 28 on the carrier cart 16 when the cart 16 is engaged with the position controller 22, thereby releasing the lock and switching on the hydraulic cylinder 367, only when the hydraulic cylinder is activated to allow the vertical movements of the fork 30.

The operation of switching the cassette table 13 when the parts cassettes 9 on the component feeder table 7b (FIG. 1) have been exhausted and need to be replaced in whole will now be explained.

The component feeder table 7b is first brought to the table switching location P in the retraction area of the component feeder unit 5 and its cassette table 13 is separated from the movable table 12 by the empty carrier cart 16.

Specifically, the carrier cart 16 is entered into the retraction area of the component feeder unit 5 from behind and positioned. As the carrier cart 16 is advanced, the guide surfaces 21a, 21a of the legs 21, 21 come into contact with the position controlling rollers 22a, 22a of the position controller 22 respectively, so that the lateral movements of the carrier cart 16 are restrained. The position of the carrier cart 16 in lateral directions is further properly controlled by locator pins 318, 318 fitted into the V-shaped notches 319, 319 of the right and left support bars 314, 314 of the movable table 12 respectively (See FIG. 2). At a final stage of the approaching movement, the matching roller 24 couples with the hook 23 of the position controller 22, thereby controlling fore- and backward positions and restraining retreat of the carrier cart 16. Simultaneously, the lock release switch 28 of the carrier cart 16 is switched on upon hitting against the block 27 for enabling the fork 30 to start a lifting motion.

When the carrier cart 16 is carrying no tables, the fork 30 is set at its lower position. When the carrier cart 16 is positioned in the component feeder unit 5 as has been described, the clamp which is locking the cassette table 13 on the movable table 12 is released. This is carried out by actuating the air cylinders 25, 25 to rotate the eccentric cams 311, 311 by a predetermined angle so that the spaces 322, 322 between the eccentric cams 311, 311 and the engaging blocks 321, 321 are widened. As the eccentric cams 311, 311 are rotated, they are pressed against the contact surfaces 334, 334 of the release side blocks 321b, 321b, thus moving the cassette table 13 slightly in the direction denoted by Q in FIGS. 2 and 3. The hydraulic cylinder 367 is then activated by the operation handle 29 for lifting up the fork 30. As the fork 30 is lifted with its arms 30a, 30a holding two sides 335, 335 of the cassette table 13, the cassette table 13 is separated from the movable table 12.

By further raising the fork 30, the cassette table 13 is more firmly clamped at its both sides 335, 335 held between the fork 30 and the fixing frame 366.

The release cylinder 35 is then actuated for returning the hook 23 to its release state to disengage from the matching roller 24 of the carrier cart 16 before the carrier cart is moved backward. The carrier cart 16 removed from the retraction area of the component feeder unit 5 is transferred to an exchanging place where the parts cassettes 9 which have been exhausted all or a predetermined amount of components are replaced with new ones.

The movable table 12 separated from the cassette table 13 is then reloaded with another cassette table 13 which is filled with the fully loaded parts cassettes 9 meeting desired requirements. The reloading is hereinafter explained.

The carrier cart 16 carrying the fully loaded cassette table 13 between the fork 13 and the fixing frame 366 is advanced to the retraction area of the component feeder unit 5. The carrier cart 16 is then positioned and locked similarly as described above.

When the cassette table 13 on the carrier cart 16 is brought to locate above the movable table 12, the hydraulic cylinder 367 is operated by the operation handle 29 for descending the fork 30. As the cassette table 13 is lowered with the fork 30, the position controlling bars 315, 315 sit on the support bars 314, 314 of the movable table 12, and the eccentric cams 311, 311 are brought to locate in the spaces 322, 322 between the engaging blocks 321, 321. The fork 30 is further lowered to be freed from the cassette table 13. This is followed by actuating the release cylinder 35 to disengage the hook 23 and the matching roller 24. Then, the free carrier cart 16 is retreated to be removed from the retraction are of the component feeder unit 5.

At the same time when the carrier cart 16 is about to be retreated, the air cylinders 25, 25 are actuated to rotate the eccentric cams 311, 311 by a predetermined angle in the counterclockwise direction. As the eccentric cams 311, 311 are rotated, they are pressed against the contact surfaces 333, 333 of the clamp side blocks 321a, 321a in a direction denoted by S in FIGS. 2 and 3. Accordingly, the cassette table 13 is moved in the direction S by a very small distance because the cassette table 13 has roughly been positioned in relation to the movable table 12. As shown in FIG. 2, the lateral position of the cassette table 13 is restrained by the right position controlling bar 315 touching at its right side the plate 313 on the right support bar 314 of the movable table 12. The position in fore- and backward directions is controlled by the position controlling bars 315, 315 of the cassette table 13 touching the front positioning roller 312, 312 at the distal end thereof. Also, the pressing action permits the tapered surface 320 of the eccentric cam 311 to lower the sloped contact surface 333 of the clamp side block 321a. Accordingly, as its position controlling bar 315 presses against the support bar 314, the cassette table 13 is securely clamped on the movable table 12. In this manner, the cassette table 13 is precisely joined to the movable table 12 and assembled as the component feeder table 7b.

Before the movable table 12 is loaded with the cassette table 13, its air ejecting outlets 317, 317 supply jets of air for blowing out dust and dirt from the upper sides of the support bars 314, 314 of the movable table 12 to ensure close joining between the movable table 12 and the cassette table 13. The emission of jets of air from the air ejecting outlets 317, 317 may be started upon the cassette table 13 being lifted down and continued until the position controlling bars 315, 315 come into direct contact with the support bars 314, 314. This allows cleaning over the upper side of each support bar 314 as well as the lower side of each position controlling bar 315, hence yielding a more preferable effect.

The carrier cart 16 removed from the retraction area of the component feeder unit 5 is further used for receiving another component consumed cassette table 13 from the movable table 12 for exchanging the parts cassettes 9.

As set forth above, a group of the parts cassettes carried on the cassette table can be replaced with a new table in whole, hence decreasing the duration of exchanging the parts cassettes and minimizing the downtime even in production of different models of circuit board in small quantity or when a great number of different components are mounted on a single circuit board.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. In a component mounting assembly for automatically mounting components on a circuit board having a component feeder unit including a component feeding area and a retraction area, and a mounting head for picking up a component supplied at the component feeder unit and mounting it at a mounting location, the improvement comprising:

movable table including a driving means installed therein for movement of the movable table between a component pickup location in the component feeding area and a table exchange location in the retraction area;

a cassette table placed on and removably attached to the movable table and carrying a multiplicity of parts cassettes thereon aligned in parallel;

a clamp means provided between the cassette table and the movable table for releasably fixing the cassette table on a top face of the movable table at the table exchange location in the retraction area of the component feeder unit such as to allow the cassette table to be attached to and detached from the top face of the movable table in a direction orthogonal to a direction of movement of the movable table;

a carrier cart provided for transferring the cassette table which is detached from the movable table; and a guiding means provided in the retraction area of the component feeder unit for positioning the carrier cart at a prescribed position.

2. A component mounting apparatus according to claim 1, wherein the carrier cart comprises a fixing frame disposed at an upper part thereof and a fork mounted beneath the fixing frame for supporting the cassette table at both sides in lifting movement and for firmly holding the cassette table between a fixing table and the fork while transporting the cassette table, the fork having a pair of locator pins which are respectively received by a pair of V-shaped positioning notches provided in the movable table, whereby the carrier cart is positioned when advanced toward the movable table, with the locator pins fitted into the V-shaped positioning notches of the movable table.

3. A component mounting apparatus according to claim 2, wherein the carrier cart further comprises a pair of legs forwardly projected from a lower end thereof and a boss for controlling positions in forward movements thereof, and the guiding means disposed at a lower side in the retraction area of the component feeder unit includes a pair of position controlling rollers for guiding and positioning the legs of the carrier cart and a hook for detachably engaging with the boss on the carrier cart for positioning and locking the carrier cart.

4. A component mounting apparatus according to claim 3, wherein the clamp comprises an engaging block mounted to a lower side of the cassette table and a rotary clamp mounted to an upper side of the movable table in such a way that the rotary clamp comes into engagement with the engaging block by rotation thereof, by which the cassette table is fixed to the movable table, preventing any vertical movements of the cassette table.

5. A component mounting apparatus according to claim 4, wherein the movable table further comprises a position restraining member for restraining positions of the cassette table in all four directions in two dimensions, in such a way that the cassette table is obliquely pushed forward via the engaging block by rotation of the rotary clamp and tightly pressed against the position restraining member.

6. A component mounting apparatus according to claim 5, wherein the movable table has air ejecting outlets provided on both ends of an upper side thereof for blowing jets of air towards a surface on which the cassette table is placed.

7. The invention of claim 1, wherein a plurality of movable tables and cassette tables are provided.

8. In a component mounting assembly for automatically mounting components on a circuit board having a mounting unit for picking up a component from a component pickup location and mounting it at a mounting location, the improvement comprising:

a mounting table;

means for driving the mounting table to the pickup location;

a cassette table removably attached to the mounting table and supporting a plurality of components; and means on the mounting table for removably clamping an underside of the cassette table to align the cassette table with the mounting table so that the component on the cassette table will be aligned when positioned at the component pickup location, including an air cylinder for providing a releasable clamping force.

9. The invention of claim 8, wherein the clamping means includes a pair of eccentric cams and the cassette table includes members for removably engaging the cam.

10. The invention of claim 8, further including means for blowing jets of air across the surface of the mounting table for cleaning.

11. In a component mounting assembly for automatically mounting components on a circuit board having a mounting unit for picking up a component from a component pickup location and mounting it at a mounting location, the improvement comprising:

a mounting table;

means for driving the mounting table to the pickup location;

a cassette table removably attached to the mounting table and supporting a plurality of components;

clamping means on the mounting table for removably clamping an underside of the cassette table to align the cassette table with the mounting table so that the components on the cassette table will be aligned when positioned at the component pickup location; and a carrier cart for transporting the cassette table to a position for attachment to the mounting table, including means for alignment of the carrier cart with the mounting table to ensure a proper alignment of the cassette table when mounted on the mounting table by the clamping means and means for vertically moving the mounting table after the means for alignment has verified the proper alignment of the cassette table.

12. The invention of claim 11 further including means for releasably fastening the carrier cart adjacent the mounting table while the cassette table is being attached to the mounting table.

* * * * *